(12) United States Patent
Yamada

(10) Patent No.: US 8,693,508 B2
(45) Date of Patent: Apr. 8, 2014

(54) LIGHT SOURCE APPARATUS AND IMAGE PICKUP APPARATUS EQUIPPED WITH SAME

(75) Inventor: Tomohiro Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 346 days.

(21) Appl. No.: 13/192,921

(22) Filed: Jul. 28, 2011

(65) Prior Publication Data

US 2012/0026504 A1    Feb. 2, 2012

(30) Foreign Application Priority Data

Jul. 30, 2010 (JP) .................................. 2010-172930

(51) Int. Cl.
*H01S 3/106* (2006.01)
*H01S 3/10* (2006.01)
*G01B 9/02* (2006.01)

(52) U.S. Cl.
USPC .................. 372/10; 372/25; 372/28; 356/450

(58) Field of Classification Search
USPC .............. 372/10, 25, 28, 9; 356/450
See application file for complete search history.

(56) References Cited

U.S. PATENT DOCUMENTS 5,408,480 A * 4/1995 Hemmati .......................... 372/10
6,980,345 B2 * 12/2005 Kim et al. ...................... 359/248
7,324,568 B2 * 1/2008 Spariosu et al. ................. 372/10
7,391,794 B2 * 6/2008 Kane ................................. 372/10
7,542,489 B2 * 6/2009 Luo et al. .......................... 372/18
2013/0121353 A1 * 5/2013 Kub et al. ......................... 372/11

FOREIGN PATENT DOCUMENTS

JP        7-307512 A        11/1995

OTHER PUBLICATIONS

Yamashita et al., Wide and fast wavelength-tunable mode-locked fiber laser based on dispersion tuning, Optics Express, Oct. 2006, pp. 9299-9306, vol. 14, No. 20.

* cited by examiner

*Primary Examiner* — Tod T Van Roy
*Assistant Examiner* — Marcia Golub-Miller
(74) *Attorney, Agent, or Firm* — Canon USA Inc. IP Division

(57) ABSTRACT

A light source apparatus includes an optical resonator formed by an optical amplification medium and an optical switch. The optical switch includes a saturable absorber and changes its transmittance or reflectance when receiving an optical pulse emitted from a light irradiation source which includes a wavelength-tunable light source. The light source apparatus emits amplified light from the optical resonator in correspondence with the center wavelength of the optical pulse from the wavelength-tunable light source. The relationship between a length L and an effective refractive index n of the optical resonator and a repetition frequency f of the optical pulse satisfies a condition $L<c/(nf)$, and a relationship between the length L and a recovery time $\tau$ in which the changed transmittance or reflectance of the optical switch recovers satisfies a condition $\tau>(nL)/c$.

10 Claims, 9 Drawing Sheets

LIGHT SOURCE APPARATUS AND IMAGE PICKUP APPARATUS EQUIPPED WITH SAME

BACKGROUND OF THE INVENTION

1. Field of the Invention

The present invention relates to a light source apparatus that can change the oscillation wavelength and an image pickup apparatus using the light source apparatus.

2. Description of the Related Art

Various light sources, especially, laser light sources that can change the oscillation wavelength have been used in the fields of communication networks and inspection apparatuses.

There are demands for high-speed wavelength switching in the field of communication networks and high-speed and wide-range wavelength sweeping in the field of inspection apparatuses.

Examples of inspection apparatuses to which wavelength-tunable (sweep) light sources are applicable are a laser spectroscope, a dispersion measuring apparatus, a film-thickness measuring apparatus, and a swept source optical coherence tomography (SS-OCT) apparatus, among others.

Optical coherence tomography (OCT) is an imaging technique in which a tomographic image of a specimen is obtained by using optical interferometry. Thus, at the heart of an OCT system is an interferometer illuminated by a broadband light source. Recently, there has been an increased interest in OCT, and abundant studies thereof have been performed in the medical field because of OCT's high spatial resolution (in the order of microns) and noninvasive imaging methods.

In SS-OCT, spectral interferometry is used to acquire depth information, but a spectroscope is not used. Hence, this technique reduces the loss of light, and is expected to acquire an image at a high signal-to-noise (SN) ratio.

In a medical image pickup apparatus to which the SS-OCT technique is applied, the image acquisition time decreases as the sweep speed increases, and the spatial resolution of a tomographic image increases as the wavelength sweep width increases. Hence, the parameters of the light source are central to obtaining an appropriate image.

More specifically, in OCT, the depth resolution is given by the following Expression (1):

$$\frac{2\ln 2}{\pi} \times \frac{\lambda_0^2}{\Delta \lambda} \quad (1)$$

where $\Delta\lambda$ represents the wavelength sweep width and $\lambda_0$ represents the oscillation wavelength of the light source. Therefore, to increase the depth resolution, it is necessary to increase the wavelength sweep width, and a wide-band wavelength swept light source is demanded.

As a light source to be used in the SS-OCT apparatus, a light source based on a dispersion tuning method that changes the wavelength by using wavelength dispersion (also simply referred to as dispersion) of the refractive index in a resonator has been studied for the band mainly used in the communication field, as is disclosed in S. Yamashita, et al., *Optics Express*, Vol. 14 (2006), p. 9299 (hereinafter referred to as Non-Patent Document 1).

In the dispersion tuning method, the oscillation wavelength in an active mode-locked state is controlled by utilizing the fact that the free spectral range (FSR) of the resonator has a wavelength dependency. That is, since wavelength sweeping is performed by changing the frequency of a modulation signal that brings about active mode locking, high-speed wavelength sweeping can be performed by changing the frequency of the modulation signal at high speed.

Here, the free spectral range indicates the frequency interval of resonator modes for light circulating in the resonator. The free spectral range (FSR) is given by the following Expression (2):

$$FSR = \frac{c}{nL} \quad (2)$$

where c represents the speed of light in a vacuum, n represents the refractive index of the resonator, and L represents the resonator length.

The dispersion tuning method utilizes the wavelength dependency of the FSR, and sweeps the center wavelength in a mode-locked state by sweeping the mode locking frequency.

Non-Patent Document 1 describes that the wavelength sweep range $\Delta\lambda$ in dispersion tuning is given by the following Expression (3):

$$\Delta\lambda = \frac{n}{cDN} \quad (3)$$

where n represents the refractive index of the resonator, D represents the dispersion parameter of the resonator, and N represents the order of mode locking (natural number).

In contrast, Japanese Patent Laid-Open No. 7-307512 (hereinafter referred to as Patent Document 1) discloses a laser apparatus in which a saturable absorber is located in the center of a Fabry-Perot optical resonator and a mode-locked operation is obtained by applying optical clock pulses to the saturable absorber in order to stably generate short optical pulses.

In wavelength sweeping using the dispersion tuning method disclosed in Non-Patent Document 1, the wavelength sweep velocity can be increased by changing the frequency of the modulation signal at high speed. However, a plurality of modes having a fixed phase relationship are simultaneously excited in the mode-locked laser, the spectral width (linewidth) of the oscillation spectrum is easy to increase. Hence, this method cannot always sufficiently respond to applications that need a narrow spectral width.

In the laser apparatus disclosed in Patent Document 1, optical pulses propagate in the right and left directions symmetrically with respect to the saturable absorber in the optical resonator and collide with each other at the saturable absorber, and optical clock pulses are simultaneously input to the saturable absorber. Patent Document 1 describes that this laser apparatus can reduce the loss of the saturable absorber to obtain a stable operation of the laser and that an ultrahigh-speed train of short optical pulses are obtained because of mode locking using the optical clock pulses. However, this laser apparatus can obtain short optical pulses, but is not designed to narrow the oscillation spectrum linewidth.

SUMMARY OF THE INVENTION

The present invention provides a light source apparatus that can achieve a narrower oscillation spectrum linewidth and higher-speed wavelength sweeping.

A light source apparatus according to an aspect of the present invention includes an optical resonator including an optical amplification medium configured to amplify light and an optical switch; and a light irradiation source configured to apply an optical pulse to the optical switch. The light source apparatus emits the light amplified by the optical amplification medium from the optical resonator. The light irradiation source includes a wavelength-tunable light source, and the optical switch changes a transmittance or a reflectance thereof when receiving the optical pulse emitted from the wavelength-tunable light source. The light source apparatus emits the amplified light from the optical resonator in correspondence with a center wavelength of the optical pulse. A resonator length L of the optical resonator satisfies the following condition:

$$L < \frac{c}{nf}$$

where f represents a repetition frequency of the optical pulse applied from the light irradiation source to the optical switch, n represents an effective refractive index of the optical resonator, and c represents the speed of velocity in a vacuum. A recovery time τ in which the changed transmittance or reflectance of the optical switch recovers satisfies the following condition:

$$\tau > \frac{nL}{c}.$$

In the light source apparatus according to the aspect of the present invention, the optical resonator includes the optical amplification medium and the optical switch. The optical switch changes its transmittance or reflectance when receiving the optical pulse emitted from the light irradiation source formed by the wavelength-tunable light source.

The light source apparatus emits amplified light in correspondence with the center wavelength of the optical pulse emitted from the wavelength-tunable light source. The relationship between the optical resonator length L and the repetition frequency f of the optical pulse is specified to satisfy the condition that (L<c/(nf)), and the relationship between the optical resonator length L and the recovery time τ in which the changed transmittance or reflectance of the optical switch recovers is specified to satisfy the condition that (τ>(nL)/c).

The relationship (L<c/(nf)) between the optical resonator length L and the repetition frequency f of the optical pulse indicates a condition that mode locking is not caused by the optical pulse introduced from the wavelength-tunable light source into the optical resonator. This is an approach to an oscillating operation different from mode locking in which the oscillation spectral width (linewidth) is easy to increase.

The relationship (τ>(nL)/c) between the recovery time τ of the optical switch and the resonator length L specifies that the recovery time of the optical switch is longer than the period (duration) of the optical pulse applied to the optical switch. Within the long recovery time τ, light can be emitted in correspondence with the period (duration) of the optical pulse exceeding the oscillation threshold value.

Accordingly, the present invention can provide a light source apparatus that narrows the spectral width (linewidth) of the oscillation spectrum.

Further features of the present invention will become apparent from the following description of exemplary embodiments with reference to the attached drawings.

DESCRIPTION OF THE EMBODIMENTS

Embodiments of the present invention will be described below with reference to the drawings.

Figure 1:
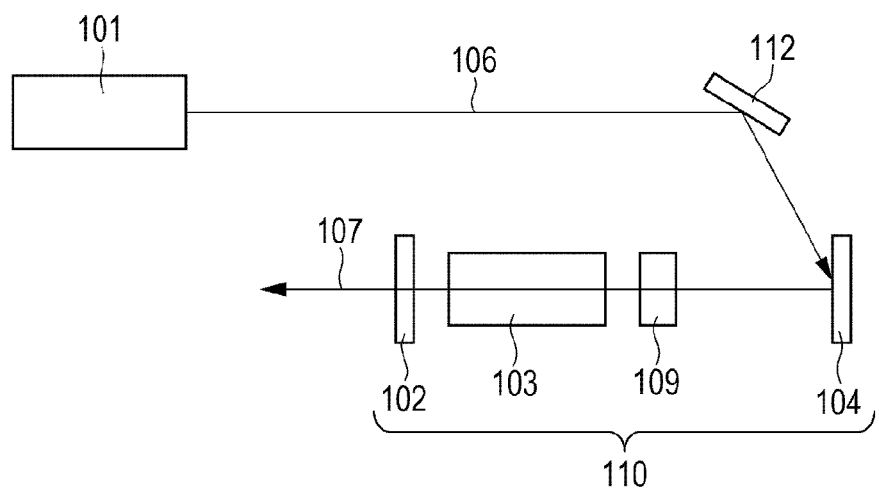
FIG. 1 schematically illustrates an example of a light source apparatus according to the present invention.

FIG. 1 schematically illustrates an example of a light source apparatus (light source) according to the present invention.

The light source apparatus illustrated in FIG. 1, in its basic form, includes an optical resonator 110 and an irradiation source 101. The optical resonator 110 (also referred to as optical cavity) includes an optical amplification medium 103 (also referred to as gain medium) disposed between a pair of mirrors. More specifically, in the present embodiment, the optical resonator 110 includes the optical amplification medium 103 disposed between a partial reflection mirror 102 and a reflective saturable absorber (mirror) 104. The irradiation source 101 applies (injects) pulsed irradiation light 106 to the reflective saturable absorber 104, which in turn reflects the pulsed light towards the optical amplification medium 103. The pulsed light will reflect multiple times between the partial reflection mirror 102 and the reflective saturable absorber 104 while being amplified by the optical amplification medium 103. The amplified light subsequently emerges from the optical resonator 110 as emergent light 107.

The irradiation source 101 (e.g., a wavelength-tunable light source) can be implemented by a dispersion tuning laser, and generates the irradiation light 106 in the form of an optical pulse. The irradiation light 106 is applied via a reflecting member (mirror) 112 to the reflective saturable absorber 104 serving as an optical switch that forms one mirror in the optical resonator 110. In the optical resonator 110 of the light source apparatus illustrated in FIG. 1, the reflective saturable absorber 104 and the partial reflection mirror 102 form a pair of mirrors. The optical amplification medium 103 and a gain flattening filter (GFF) 109 are provided between the pair of mirrors (in the resonator). The irradiation light 106 is amplified by the optical amplification medium 103 while the light is reflected between the pair of mirrors (partial reflection mirror 102 and reflective saturable absorber 104), and is emitted as emergent light 107 from the partial reflection mirror 102. Specifically, as the light confined in the optical resonator reflects multiple times between the mirrors, and due to interference effects, light of specific wavelength characteristics is amplified and emitted. That is, light amplified by the optical resonator 110 in correspondence with the center wavelength of the optical pulse of irradiation light 106 is emitted as emergent light 107.

The gain flattening filter 109 is a member that is added as required. Here, the gain flattening filter is provided to flatten the wavelength dependency of loss in the optical resonator within a wavelength sweep range. The partial reflection mirror 102, such as a half mirror or the like, includes a partially reflecting surface that allows a portion of the irradiated light 106 to be transmitted therethrough and another portion to be reflected. The reflected portion travels back to the reflective saturable absorber 104 where it is reflected towards the partial reflection mirror 102. At the reflection mirror 102, again part of the light is transmitted and part is reflected. In this oscillation process, the light is amplified by the optical amplification medium 103 on each pass. Thus, the transmitted portion is emitted as emergent light 107 and includes amplified light of specific characteristics determined by the relationship (L<c/(nf)) between the optical resonator length L and the repetition frequency f of the optical pulses.

Considering that the optical resonator 110 receives the optical pulse from the irradiation source 101 and light amplified by the optical resonator is emitted in the light source apparatus of the present invention, the irradiation source 101 and the optical resonator 110 (oscillator) are sometimes referred to as a "master laser" and a "slave laser", respectively. Thus, in the following description, these terms may be interchangeably used.

Here, the reflective saturable absorber 104 is an optical element that is highly absorbent and poorly reflective to low-intensity light, but is poorly absorbent and highly reflective to high-intensity light.

The light source apparatus of the present embodiment preferably adopts a reflective saturable absorber 104 whose reflectance is highest for the wavelength of light applied to the saturable absorber.

An example having the above-described property is a saturable absorber containing semiconductor quantum dots having different particle diameters. This property is realized by the facts that absorption of the saturable absorber appears as the sum of absorptions of the semiconductor quantum dots having different particle diameters and that the absorptions of the quantum dots for the irradiation light decreases depending on the light intensity.

Figure 7:
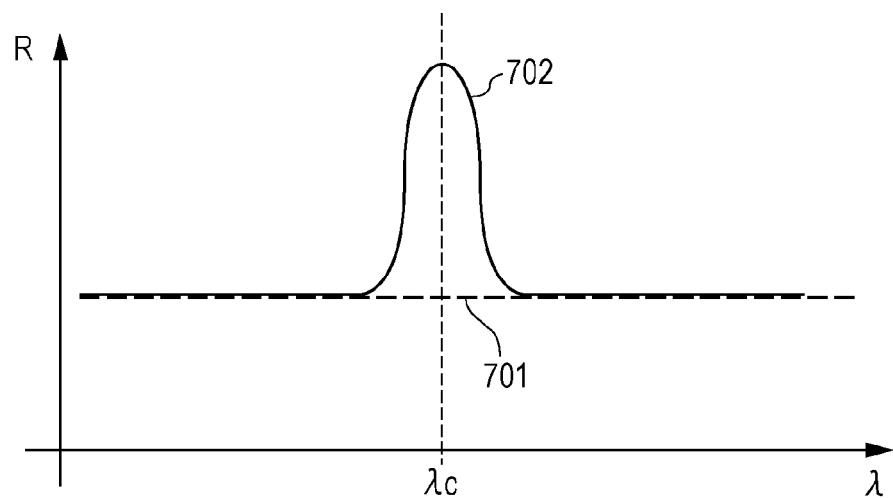
FIG. 7 is a graph showing the relationship between the reflectance and the wavelength of a saturable absorber.

FIG. 7 illustrates an exemplary spectral response of the reflective saturable absorber (mirror) 104.

In FIG. 7, a reflectance spectrum 701 is provided in a state in which light from the irradiation source 110 (master laser) is not incident on the reflective saturable absorber 104. When light with a center wavelength $\lambda c$ is incident on the reflective saturable absorber 104, the reflectance spectrum of the reflective saturable absorber 104 changes to a reflectance spectrum 702. That is, the reflectance for the wavelength $\lambda c$ increases.

Alternatively, the saturable absorber can have a property such that, when an optical pulse is applied to the saturable absorber, absorption deteriorates for wavelengths longer than the center wavelength of the applied optical pulse.

Figure 14:
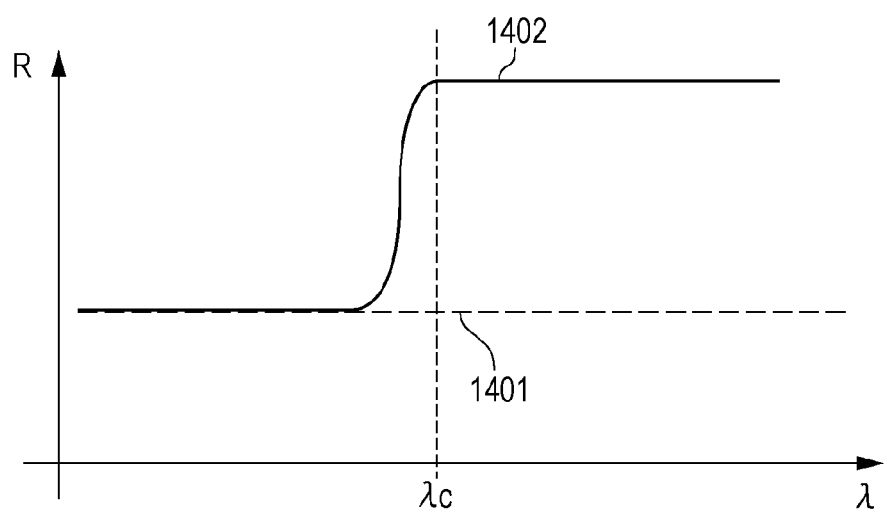
FIG. 14 is a graph showing the relationship between the reflectance and the wavelength of a saturable absorber.

As illustrated in FIG. 14, for example, when light with a center wavelength $\lambda c$ is applied to a reflective saturable absorber 104 having a mirror surface formed by a saturable absorber having such a property, the reflectance spectrum changes from a reflectance spectrum 1401 to a reflectance spectrum 1402.

In the case of FIG. 14, for example, an optical element whose loss increases as the wavelength increases is adopted in the slave laser in order to provide oscillation wavelength selectivity of the slave laser in a high-reflectance spectral region of the reflectance spectrum 1402.

Figure 15:
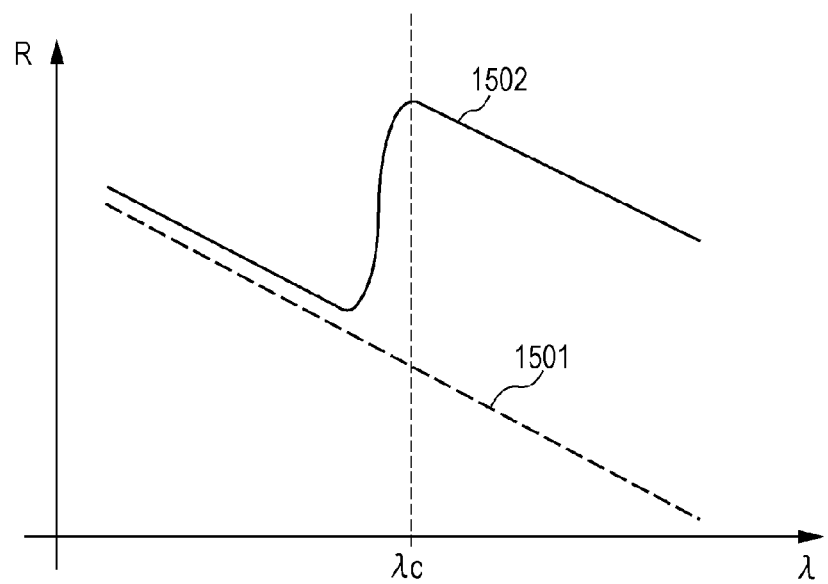
FIG. 15 is a graph showing the gain spectrum in a resonator.

As illustrated in FIG. 15, the total gain spectrum in the slave laser (optical resonator 110) is set to change from a gain spectrum 1501 before pulse irradiation from the master laser to a gain spectrum 1502 after pulse irradiation. Thus, for example, a state in which the gain becomes highest at the wavelength $\lambda c$ is obtained, and the slave laser can have oscillation wavelength selectivity. In other words, the reflective saturable absorber 104 effectively acts as an optical switch.

In the reflective saturable absorber 104, the saturable absorber may be included as a layer or coating of the reflective saturable absorber 104. As the saturable absorber, for example, a layer of semiconductor quantum dots, a semiconductor quantum well structure, pigment, or a carbon nanotube structure (e.g., graphene), or combinations thereof can be used.

The optical switch that can be adopted in the present invention is not limited to the saturable absorber, and may be formed of a photochromic material instead.

In a photochromic material, the molecular structure is changed by light irradiation, and this changes the absorption spectrum. By using the photochromic material in the slave laser (resonator), the absorption wavelength can be switched by a wavelength at which photochromism occurs.

Photochromism can recover absorption through irradiation of light with different wavelengths or heat application. That is, a preferred operation of an optical switch to be adopted in at least one embodiment of the present invention is such that absorption at a certain wavelength recovers (or the transmittance or reflectance decreases) at a predetermined time after the optical pulse is applied. Further, when the optical system simultaneously uses a plurality of photochromic materials, the oscillation wavelength can be switched at a plurality of wavelengths.

The operation of the light source apparatus illustrated in FIG. 1 will now be described in more detail.

The optical resonator 110 (slave laser) including the partial reflection mirror 102 and the reflective saturable absorber 104 is connected to a driving device (not illustrated), and is set in a standby state, where the optical resonator is not oscillated by the influence of the loss of the saturable absorber.

As illustrated in FIG. 1, an optical pulse of irradiation light 106 is applied from the irradiation source 101 to the reflective saturable absorber 104 via the reflecting member 112. Then, the reflectance at the center wavelength of the applied optical pulse increases, and the loss of the optical resonator 110 decreases. Continuous wave (CW) oscillation occurs at this wavelength in the slave laser when the reflectance at the center wavelength increases (or the loss of the resonator decreases) beyond an oscillation threshold value. This CW oscillation damps as absorption of the saturable absorber recovers, and stops in time.

In order for oscillation of the slave laser to stop in response to the recovery of absorption of the saturable absorber, the light intensity in the slave laser during oscillation needs to be sufficiently lower than the peak value of the optical pulse applied from the master laser. If the light intensity in the slave laser resonator during oscillation is higher than the optical pulse applied from the master laser, absorption of the saturable absorber always saturates during oscillation and cannot recover.

In the optical system of the apparatus illustrated in FIG. 1, the recovery time of the saturable absorber is preferably longer than the duration of the optical pulse applied to the saturable absorber. This is a suitable condition for reducing the linewidth when the optical pulse applied from the master laser is close to a Fourier limited pulse.

However, when the value of $\Delta t \times \Delta v$ of the optical pulse from the master laser ($\Delta t$ represents the duration of the time waveform of the optical pulse, and $\Delta v$ represents the frequency width in the spectral region of the optical pulse) is much larger than that of the Fourier limited pulse, the linewidth can be narrowed even when this condition is not satisfied.

The reason is as follows. A bandwidth where the reflectance or transmittance increases in the saturable absorber of the slave laser is narrower than or equivalent to a bandwidth of the optical pulse from the maser laser, and oscillation of the slave laser does not force multimode oscillation such as longitudinal multimode oscillation. Hence, a resonator mode closest to the center wavelength of the band where the reflectance or transmittance increases is intensively used.

Pulse irradiation and light emission will now be described with reference to FIG. 8.

Figure 8:
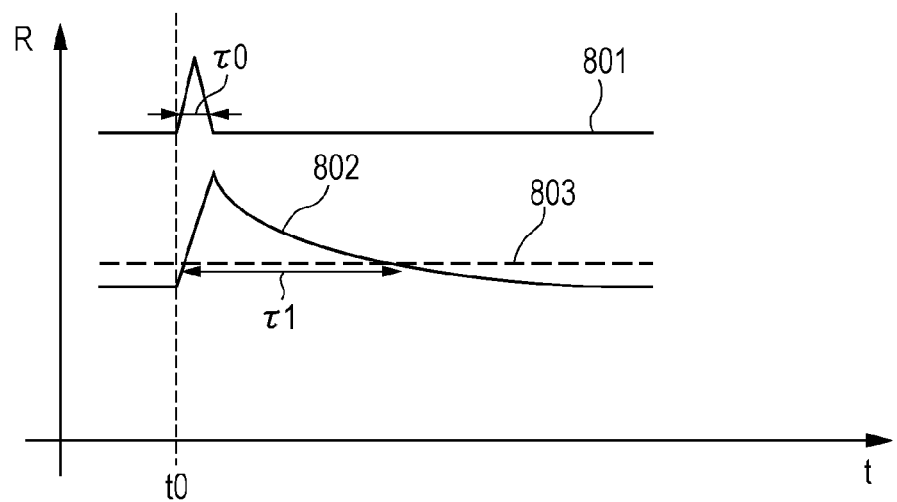
FIG. 8 is a graph showing the relationship between the time and the reflectance.

As illustrated in FIG. 8, when an optical pulse with a duration $\tau 0$ is applied from the irradiation source 101 (wavelength swept light source or master laser) to the reflective saturable absorber 104 at a time t0 (optical pulse intensity 801), the reflectance spectrum of the saturable absorber increases in response to the application of the pulse.

The reflectance of the saturable absorber gradually decreases after the completion of application of the optical pulse, and returns to its original value in time (reflectance 802). In this case, a time $\tau 1$ in which the reflectance of the saturable absorber is higher than the reflectance for causing oscillation of the slave laser (oscillation threshold reflectance 803) is longer than the duration $\tau 0$ of the optical pulse. Hence, $\tau 0$ and $\tau 1$ have a relationship shown in FIG. 8 for example.

When a pulse with a certain wavelength from the master laser enters the slave laser, CW oscillation starts at the certain wavelength in the slave laser. To minimize the linewidth of the CW oscillation, it is preferable that the oscillation continuation time be as long as possible. That is, since the time $\tau 1$ serves as the oscillation continuation time of the slave laser, it is preferable that $\tau 1$ be as long as possible.

When the next pulse enters the slave laser from the master laser, the CW oscillation with the previous pulse in the slave laser needs to be stopped because the center wavelength is slightly different from that of the previous optical pulse during wavelength sweep operation.

Under these conditions, a desired recovery time of the saturable absorber is less than or equal to the pulse rate and is also as long as possible.

For example, in consideration of an application to a light source used in an SS-OCT apparatus, when the pulse rate of the light source is set at 1 GHz, absorption of the saturable absorber preferably recovers so that oscillation of the slave laser stops in 1 ns. That is, $\tau 1$ is preferably shorter than or equal to 1 ns.

Figure 12:
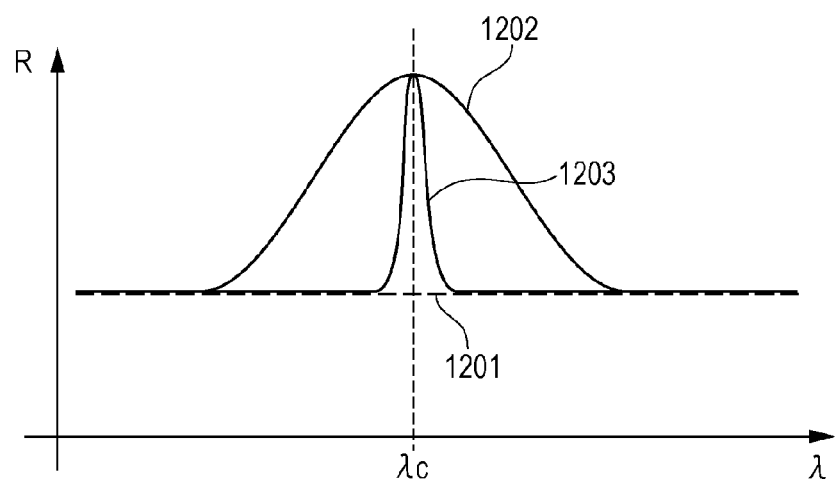
FIG. 12 is a graph showing the relationship between the reflectance and the wavelength of a saturable absorber.

As illustrated in FIG. 12, when the optical pulse applied from the wavelength-tunable light source to the saturable absorber in the optical resonator has a certain wavelength band, the reflectance of the saturable absorber also increases in a certain wavelength band.

However, the optical amplification medium in the optical resonator is not subjected to driving that promotes longitudinal multimode oscillation, for example, as in a mode-locked laser, but is subjected to simple CW driving (the gain is steady).

For this reason, oscillation in the optical resonator does basically not occur in the entire band where the reflectance of the saturable absorber increases, but occurs in a narrow wavelength range where the reflectance increases most.

Therefore, when the reflectance spectrum of the saturable absorber is changed from a reflectance spectrum 1201 to a reflectance spectrum 1202 by pulse irradiation from the master laser, the slave laser provides an oscillation spectrum 1203.

For this reason, it is preferable that the recovery time of the saturable absorber should be sufficiently longer than the duration of the applied optical pulse. This can narrow the bandwidth of laser oscillation caused in the slave laser.

Therefore, even when the optical pulse applied to the saturable absorber has a wide band, light emitted from the slave laser has a spectral band much narrower than that of the optical pulse from the master laser.

Accordingly, a light source in which the linewidth of an instantaneous pulsed light is narrowed can be formed by a wavelength swept light source that performs short-pulse operation. Since wavelength sweeping can be performed with a narrow linewidth at high speed in a wide wavelength sweep range, high-definition image pickup can be performed at high speed and at high depth resolution by adopting this light source in an SS-OCT apparatus.

The light source apparatus of the present invention preferably operates so that the slave laser is not injection-locked. This is because the light source apparatus of the present invention does not aim to generate a short pulse train by emitting a pulse having a long time waveform from the slave laser.

Therefore, a pulse rate f of the pulse applied from the master laser to the saturable absorber needs to satisfy the following Conditional Expression (4):

$$\frac{c}{nL} \times m < f < \frac{c}{nL} \times (m+1) \quad (4)$$

where n represents the effective refractive index of the optical resonator in the slave laser, L represents the resonator length, c represents the speed of light in a vacuum, and m is a natural number. The effective refractive index of the optical resonator takes into account the refractive index of the optical amplification medium, as well as the refractive indices of the free space and optics (if any) contained between the pair of mirrors in the optical oscillator.

A condition that an oscillation mode of the operation of the slave laser is determined within the time interval of irradiation of the optical pulse from the master laser is given by the following Conditional Expression (5) according to a condition that light circulates at least once in the optical resonator during the time interval of the pulse irradiation:

$$L \le \frac{c}{nf}. \quad (5)$$

Expression (5) is given when m=0 in Expression (4). It is understood from this that the optical resonator is not mode-locked when the slave laser operates so as to satisfy Conditional Expression (5).

Further, since the resonator mode is determined when light circulates at least once in the optical resonator within the recovery time τ of the saturable absorber, the recovery time τ satisfies the following Conditional Expression (6):

$$\tau > \frac{c}{nL}. \quad (6)$$

For example, when the pulse rate of the optical pulse emitted from the irradiation source (master laser) is 1 MHz, the product of the resonator length L of the slave laser and the effective refractive index n needs to be less than or equal to about 300 m, which is the distance at which light propagates in a vacuum within 1 μsec.

To limit the oscillation linewidth of the laser light emitted from the slave laser to a Hz or less, for example, the duration of the output waveform of a Fourier-limited Gaussian pulse needs to satisfy the following Conditional Expression (7):

$$\Delta t \ge \frac{0.441}{a}. \quad (7)$$

Therefore, the lower limit of the recovery time of the saturable absorber can be found from Conditional Expression (7) on the basis of the spectral linewidth.

For example, when the wavelength is 1060 nm and the light source is used as an SS-OCT light source, the linewidth is preferably 0.1 nm or less. To obtain this linewidth, according to Conditional Expression (7), the duration of the pulse and the recovery time of the saturable absorber need to be about 16.5 ps or more.

As the recovery time of the saturable absorber in the slave laser increases and the continuation time of light emitted from the slave laser increases, the linewidth of the light emitted from the slave laser decreases. Hence, by using a saturable absorber whose recovery time is longer than the duration of the optical pulse from the master laser, an optical pulse having a duration longer than that of the optical pulse from the master laser can be output from the slave laser and the spectral linewidth can be narrowed further.

Examples of light irradiation sources that can be adopted in the present invention are short-pulse wavelength swept light sources. More specifically, the short-pulse wavelength swept light sources include a dispersion tuning laser, a titanium-sapphire laser, a light source that conducts wavelength conversion and sweeping on light emitted from a laser with a nonlinear optical crystal or the like, and a wavelength-tunable pulsed light source including a gain medium such as pigment or other media having a wide gain band, and a wavelength tunable filter.

While the optical components in the optical resonator are connected by the spatial optical system in the light source apparatus illustrated in FIG. 1, they may be connected by an optical fiber optical system instead.

Figure 2:
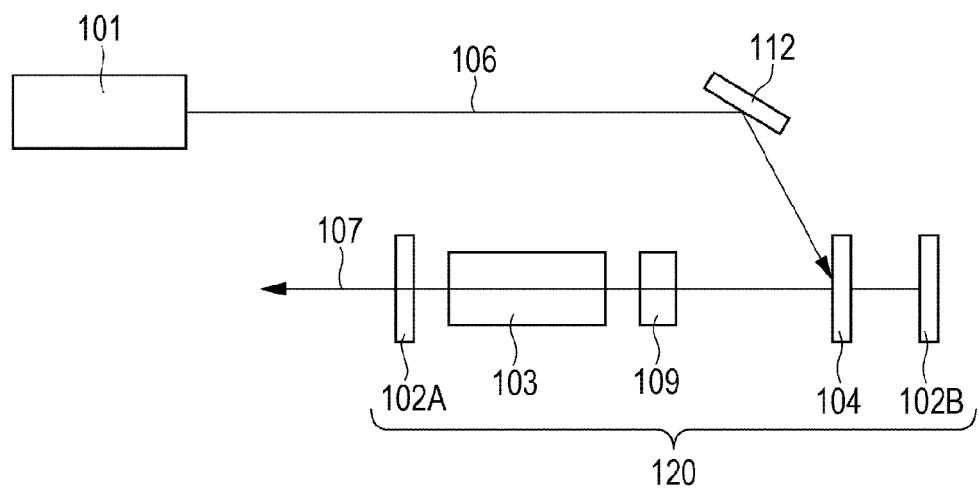
FIG. 2 schematically illustrates another example of a light source apparatus according to the present invention.

While the reflective saturable absorber 104 is used as the reflecting mirror in the device of FIG. 1, in FIG. 2, a transmissive saturable absorber 104 is used instead. When the transmissive saturable absorber 104 is used, reflectance thereof is minimized such that transmittance increases when an optical pulse of irradiation light 106 is applied thereto from the irradiation source 101 (master laser), as illustrated in FIG. 2.

In the remaining description of the specification, like components are denoted by like reference numerals throughout the drawings, and redundant descriptions thereof are minimized.

In the device illustrated in FIG. 2, a partial reflection mirror 102A and a mirror 102B form the pair of mirrors of an optical resonator 120, and a transmissive saturable absorber 104 is disposed between the pair of mirrors. Other structures are similar to those adopted in the light source apparatus of FIG. 1.

Figure 3:
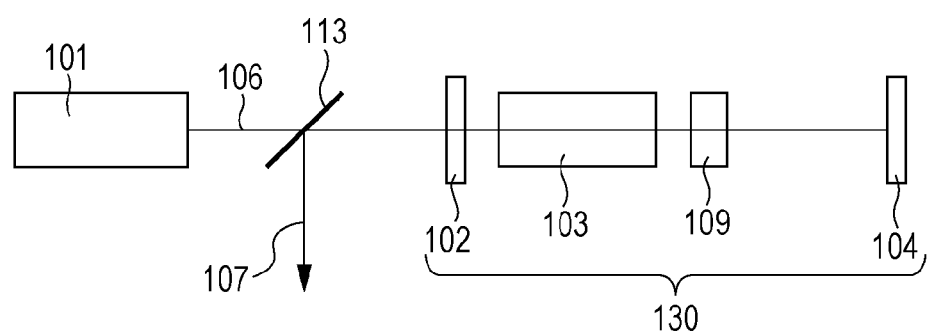
FIG. 3 schematically illustrates a further example of a light source apparatus according to the present invention.

Alternatively, as illustrated in FIG. 3, irradiation light 106 emitted from irradiation source (a master laser) 101 may be applied to a transmissive saturable absorber 104 through an optical amplification medium 103 in an optical resonator (slave laser) 130, instead of being directly applied to the reflective saturable absorber 104 (as in FIG. 1). In FIG. 3, reference numeral 113 denotes a beam splitter.

Figure 4:
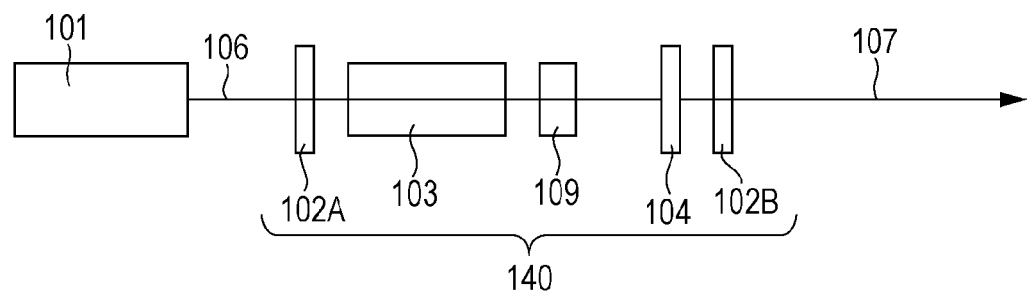
FIG. 4 schematically illustrates an even further example of a light source apparatus according to the present invention.

Further alternatively, as illustrated in FIG. 4, pulsed light may be applied to a transmissive saturable absorber 104 through an amplifier 103 in optical oscillator 140. In this manner, the applied irradiation light 106 can be amplified while reciprocating (oscillating) between a partial reflection mirror 102B and a partial reflection mirror 102A, and be then emitted from the partial reflection mirror 102B (the saturable absorber 104 is transmissive).

Figure 5:
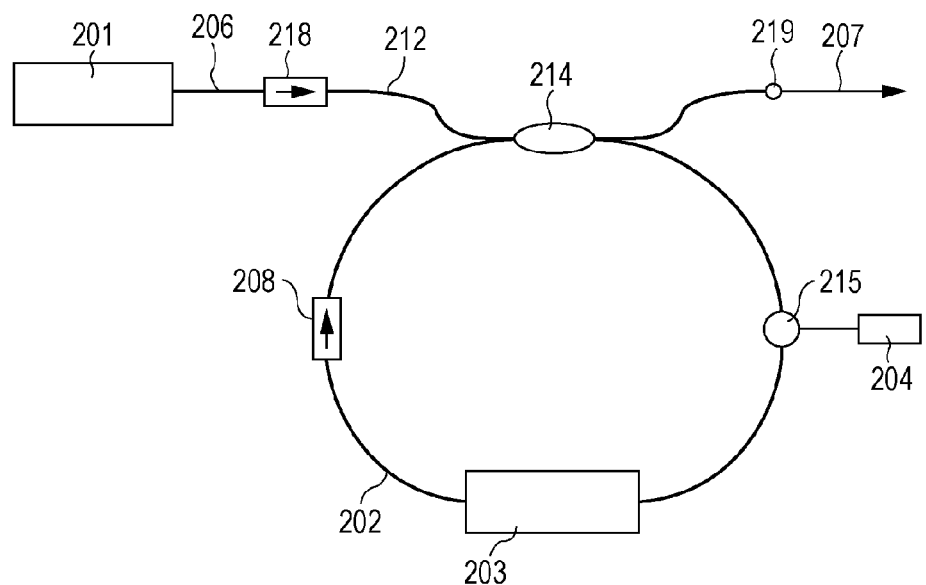
FIG. 5 schematically illustrates an even further example of a light source apparatus according to the present invention.
Figure 6:
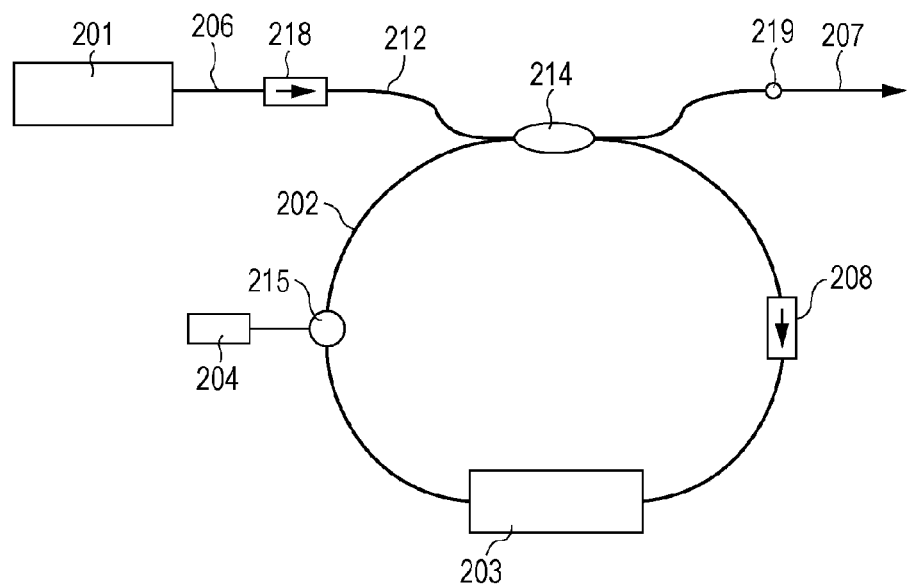
FIG. 6 schematically illustrates an even further example of a light source apparatus according to the present invention.

Further alternatively, an optical system of a ring resonator type can be used, as illustrated in FIGS. 5 and 6.

In FIG. 5, pulsed light 206 emitted from a wavelength-tunable light source 201 travels in an optical fiber 212 through an isolator 218, and is introduced into a ring resonator through a fiber coupler 214. In the ring resonator, an optical fiber 202 serving as a waveguide and an optical amplifier (amplification medium) 203 are connected. The ring resonator is connected to a saturable absorber mirror 204 via a circulator 215. Light passing through the ring resonator is emitted as emergent light 207 through the coupler 214 and a collimator 219. In FIG. 5, an optical isolator 208 is included in optical fiber 202.

An apparatus illustrated in FIG. 6 is similar to the device of FIG. 5 except in the connecting position between a circulator 215 and a saturable absorber mirror 204.

In the present embodiment, as the optical amplification medium, not only the semiconductor optical amplifier, but also a rare-earth doped optical fiber containing erbium, neodymium, or the like, and an optical fiber that performs amplification with doped pigment can be adopted.

The semiconductor optical amplifier is suitably used because of its small size and high-speed controllability. As the semiconductor optical amplifier, a resonator type optical amplifier and a traveling-wave optical amplifier can be used. The semiconductor optical amplifier can be formed of compound semiconductors that form typical semiconductor lasers, for example, InGaAs, InAsP, GaAlSb, GaAsp, AlGaAs, and GaN compound semiconductors. The center wavelength of gain of the semiconductor optical amplifier can be appropriately selected from 840 nm, 1060 nm, 1300 nm, and 1550 nm according to the application of the light source.

A SS-OCT apparatus will now be described.

In the SS-OCT apparatus, interference of the reflectance spectrum from an object is obtained while sweeping the wavelength of a light source. For that purpose, the spectral linewidth of the light source needs to be smaller than the wavelength interval between points for obtaining the spectrum. For example, to obtain the spectrum at 1000 points in a sweep band of 840±40 nm, the linewidth is preferably 0.08 nm or less so that the points can be separated.

The light source apparatus of the first embodiment is suitably used in the SS-OCT apparatus because the device can obtain a narrow oscillation spectral linewidth.

First Embodiment

A light source apparatus according to a first embodiment will be described with reference to FIG. 9.

Figure 9:
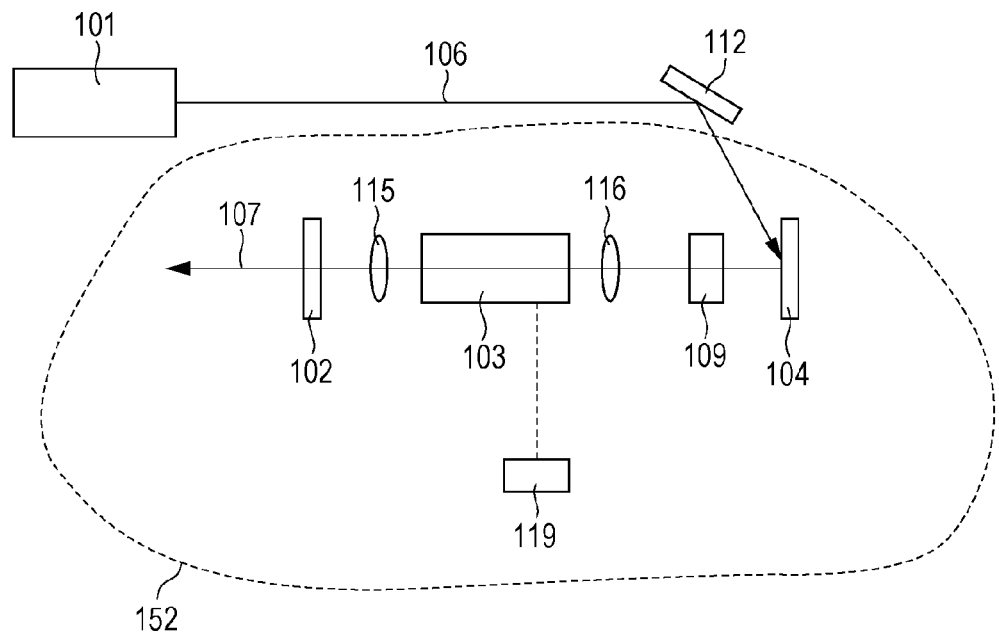
FIG. 9 illustrates a first embodiment of the present invention.

The light source apparatus illustrated in FIG. 9 includes a light irradiation source 101 and an optical resonator 152. The light irradiation source 101 is formed by a wavelength-tunable light source.

The optical resonator 152 includes a semiconductor optical amplifier serving as an optical amplification medium 103, an excitation source 119 that injects energy into the semiconductor optical amplifier, a reflective saturable absorber (mirror) 104, a gain flattening filter (GFF) 109, a partial reflection mirror 102, and light-collecting optics 115 and 116 that couple light in the resonator.

The operation of the light source apparatus of the first embodiment will be described below.

Irradiation light 106 emitted from the irradiation source (wavelength-tunable light source) 101 is an optical pulse train, and the center wavelength varies among pulses so that the irradiation light 106 serves as a wavelength swept light source. Wavelength sweeping is performed within the wavelength range of 800 to 880 nm, the sweep period is 10 kHz, and the pulse rate is 10 MHz. The duration of each pulse is 200 ps, and the effective resonator length of a slave laser is 30 cm.

A predetermined energy is injected to the semiconductor optical amplifier 103, and the semiconductor optical amplifier 103 is set in a standby state. The term "standby state" refers to a state in which the reflective saturable absorber 104 in the optical resonator 152 is not irradiated with light from the irradiation source (wavelength-tunable light source) 101 and an injection energy slightly less than the oscillation threshold value is applied to the optical amplification medium 103.

The optical pulse of the irradiation light 106 is sequentially applied to the saturable absorber 104. The optical pulse increases the reflectance of the saturable absorber 104 at the center wavelength thereof. When the reflectance of the saturable absorber 104 is increased by the irradiation light 106, laser oscillation occurs in the optical resonator 152 at the wavelength where the reflectance of the saturable absorber 104 is increased.

Figure 11:
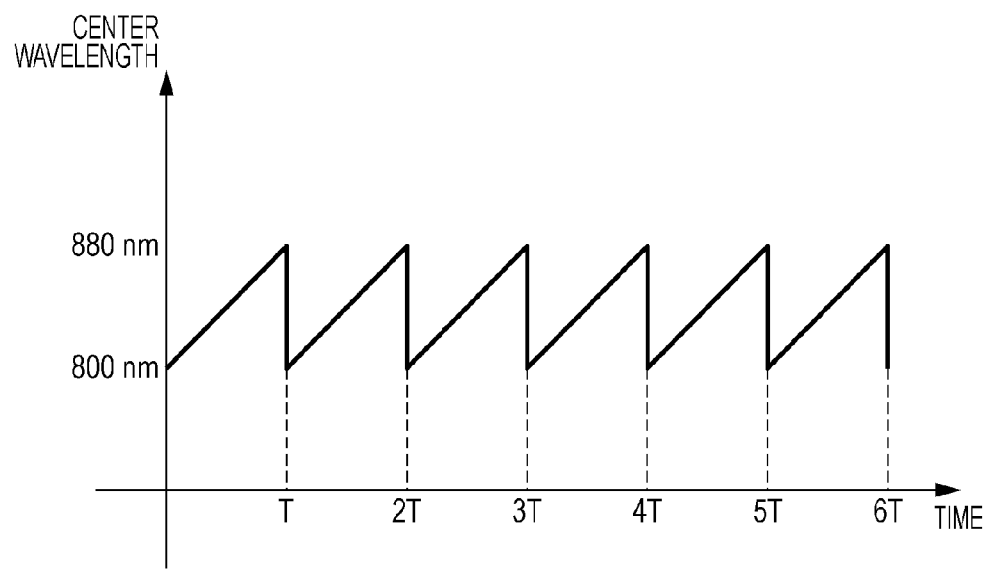
FIG. 11 is a graph showing the relationship between the oscillation wavelength and the time.

Therefore, when the center wavelength of the optical pulse of the irradiation light 106 changes within the range of 800 to 880 nm with a period T, the wavelength of the laser light emitted from the optical resonator 152 also changes within the range of 800 to 880 nm with the period T (100 μs). For example, when it is assumed that the wavelength of the optical pulse of the irradiation light 106 change with time, as illustrated in FIG. 11, the wavelength of emergent light 107 changes in a manner similar to that shown in FIG. 11.

The oscillation state changes with time as follows.

For example, when the recovery time of the saturable absorber 104 is 10 ns, the oscillation state at each wavelength in the optical resonator 152 continues for about 10 ns.

Figure 13:
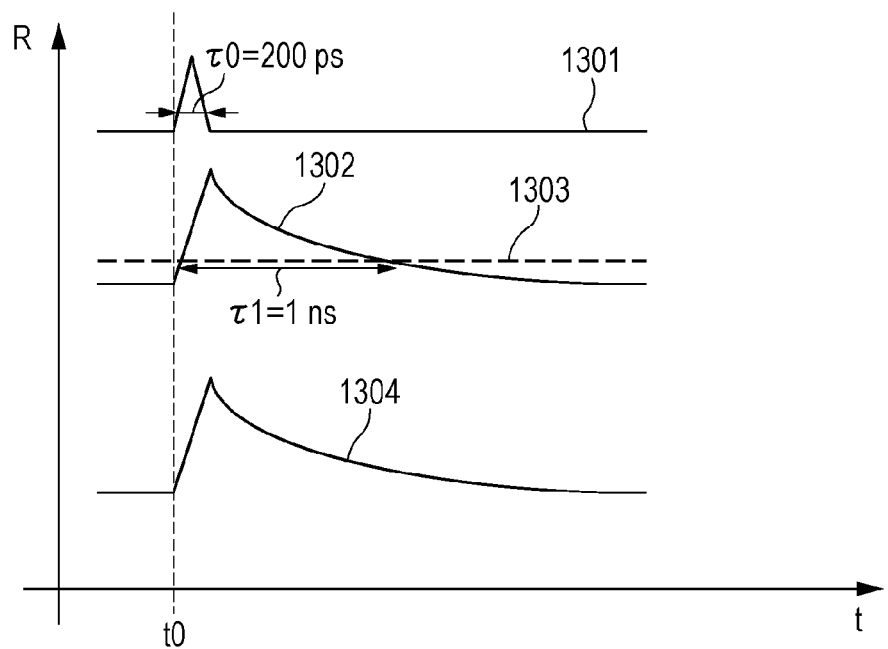
FIG. 13 is a graph showing the relationship between the reflectance and the time.

In FIG. 13, when irradiation light 1301 with a duration of 200 picoseconds (ps) enters the saturable absorber 104 at a time t0, a reflectance 1302 of the saturable absorber 104 increases at the time t0, and then decreases in a time of about 10 ns as shown in the graph. As absorption of the saturable absorber 104 recovers, the intensity of emergent light 1304 from the optical resonator also decreases in an equivalent time. In FIG. 13, reference numeral 1303 denotes an oscillation threshold reflectance.

That is, since the continuation time of the light from the optical resonator is originally longer than the duration of the irradiation light 106 from the irradiation source (wavelength-tunable light source) 101, the spectral linewidth can be narrowed in inverse proportion to the continuation time.

According to the light source apparatus of the first embodiment, light whose oscillation spectral linewidth is narrowed in wavelength sweeping operation can be obtained without sacrificing the sweep velocity and the wavelength sweep range of the wavelength-tunable light source.

Second Embodiment

Figure 10:
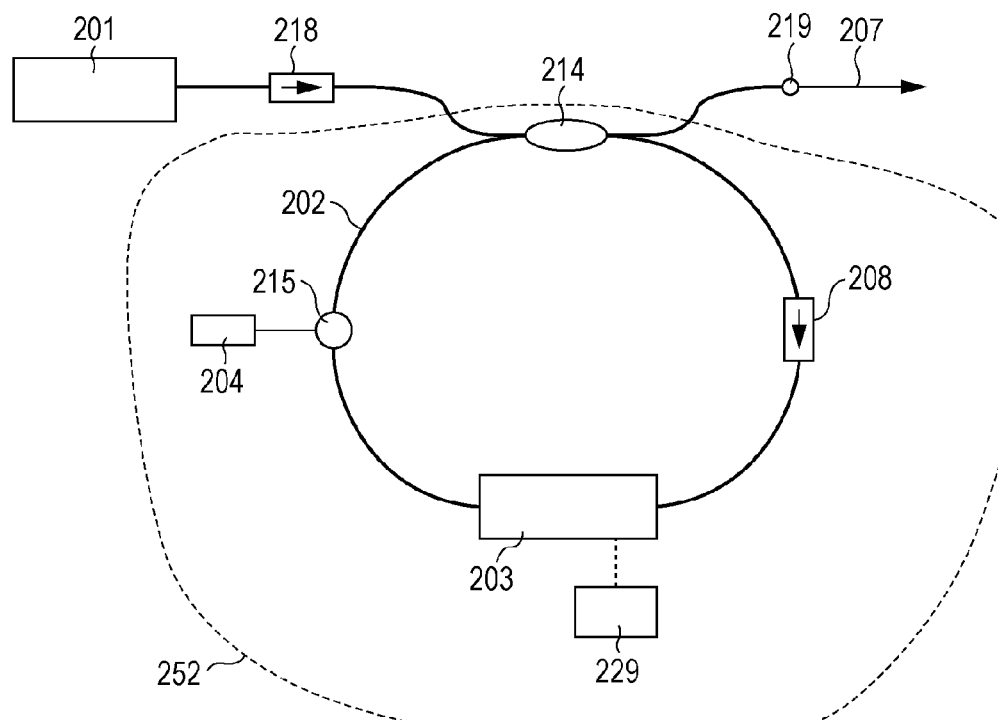
FIG. 10 illustrates a second embodiment of the present invention.

FIG. 10 illustrates the configuration of a light source apparatus according to a second embodiment.

A light source apparatus according to the second embodiment includes a wavelength-tunable light source 201 and a optical resonator 252 formed by a fiber optical system.

In the optical resonator 252, an optical pulse is introduced from the wavelength-tunable light source 201 into a ring type resonator through an isolator 218 and a coupler 214.

The introduced optical pulse passes through an isolator 208 and enters an optical amplifier 203, where the intensity thereof is amplified. The optical amplifier 203 is driven by a control device 229.

The amplified optical pulse passes through a circulator 215, is reflected by a saturable absorber mirror 204, and is returned to an optical fiber 202. Then, the optical pulse is taken out from the coupler 214, and is collimated by a collimator 219 to produce emergent light 207.

In the second embodiment, the optical resonator is a ring type resonator, and the resonator length is 3 m.

Here, the operation of the light source apparatus of the second embodiment will be described.

The center wavelength of the optical pulse emitted from the wavelength-tunable light source 201 varies among optical pulses, and the optical pulse operates as a wavelength swept light source. The wavelength sweep range is 1000 to 1120 nm, the sweep period is 1 kHz, and the pulse rate is 1 MHz. The duration of each pulse in the time waveform is 100 ps.

First, energy is injected to the optical amplifier 203, and the optical amplifier 203 is set in a standby state.

The optical pulse emitted from the wavelength-tunable light source 201 is amplified by the optical amplifier 203, and is then sequentially applied to the saturable absorber mirror 204. The reflectance of the saturable absorber mirror 204 increases at the center wavelength of the optical pulse.

At the wavelength where the reflectance of the saturable absorber mirror 204 increases, laser oscillation occurs in the optical resonator 252.

Figure 16:
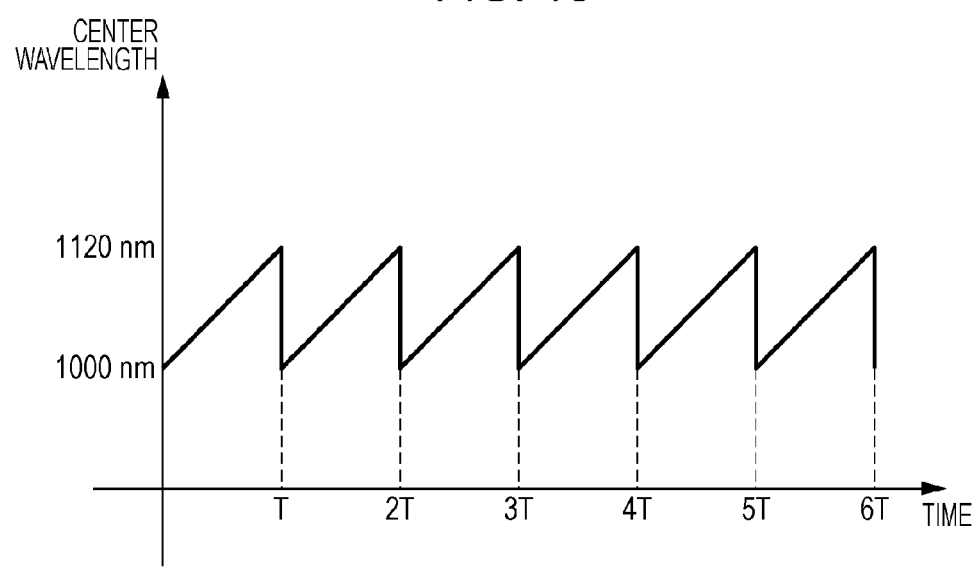
FIG. 16 is a graph showing the relationship between the oscillation wavelength and the time.

Therefore, as the center wavelength of the optical pulse changes with time in the range of 1000 to 1120 nm with a period T, the wavelength of the laser light emitted from the optical resonator also changes in the range of 1000 to 1120 nm with the period T (1 ms). For example, when the wavelength of the optical pulse changes with time, as illustrated in FIG. 16, the wavelength of emergent light 1012 changes in a manner similar to that of FIG. 16.

According to the light source apparatus of the second embodiment, the oscillation spectral linewidth of swept light from the wide-band and short-pulse wavelength-tunable light source can be narrowed without sacrificing the sweep velocity and the sweep wavelength range of the wavelength-tunable light source.

By applying the optical pulse from the wavelength-tunable light source 201 to the saturable absorber mirror 204 after amplifying the intensity of the optical pulse with the optical amplifier, as in the second embodiment, wavelength swept laser light can be stably taken out from the slave laser even when the intensity of the optical pulse serving as seed light from the wavelength-tunable light source 201 is low.

Third Embodiment

An optical coherence tomographic (OCT) image pickup apparatus using a light source apparatus according to a third embodiment of the present invention will be described.

Figure 17:
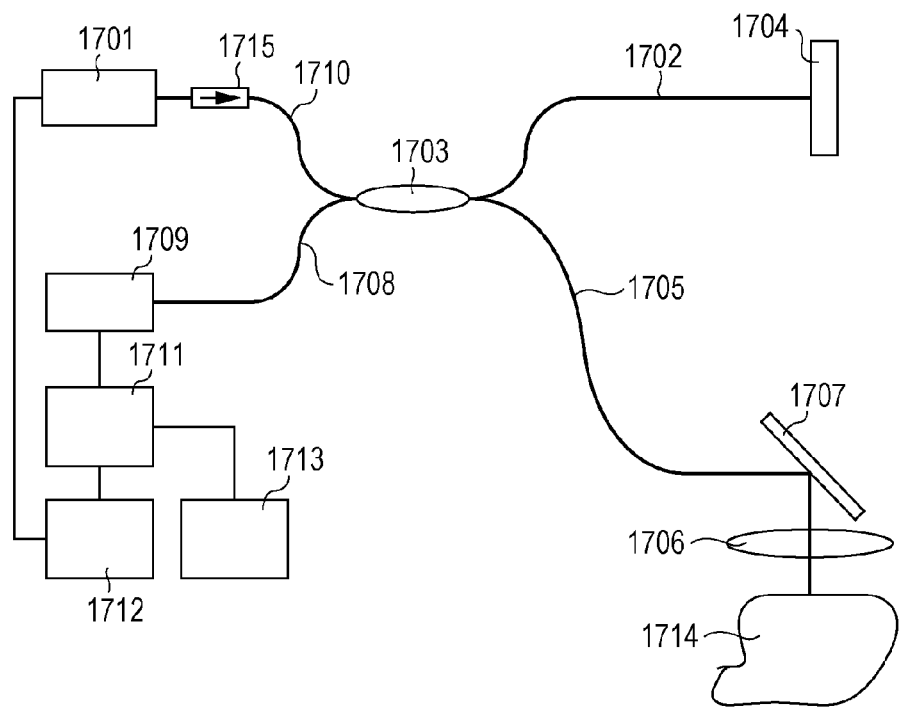
FIG. 17 illustrates a third embodiment of the present invention.

FIG. 17 illustrates the configuration of the OCT image pickup apparatus. The OCT image pickup apparatus illustrated in FIG. 17 basically includes a light source section (e.g., 1701), a specimen measuring section (e.g., 1707), a reference section (e.g., 1702), an interference section (1703), a light detecting section (e.g., 1709), and an image processing section (1711). The specimen measuring section irradiates a specimen with light from the light source section and transmits a reflected beam from the specimen. The reference section irradiates a reference mirror with light and transmits a reflected light beam from the reference mirror. The interference section causes the two reflected light beams to interfere with each other. The light detecting section detects interference light obtained from the interference section. The image processing section performs image processing (obtains a tomographic image) on the basis of the light detected by the light detecting section. These components will be described below.

The light source section includes a wavelength-tunable light source 1701 and a light-source control unit 1712 that controls the wavelength-tunable light source 1701. The wavelength-tunable light source 1701 is connected to a fiber coupler 1703 included in the interference section via an optical fiber 1710 for light irradiation and an optical isolator 1715. The fiber coupler 1703 in the interference section functions as a single mode type in the wavelength band of the light source, and other fiber couplers are 3 db couplers.

The reference section includes a reflecting mirror 1704, and a reference-light optical path fiber 1702 connected thereto. The reference-light optical path fiber 1702 is also connected to the fiber coupler 1703.

The specimen measuring section includes an inspection-light optical path fiber 1705, an irradiation-light collecting optical system 1706, and an irradiation-position scanning mirror 1707. The inspection-light optical path fiber 1705 is connected to the fiber coupler 1703. In the fiber coupler 1703, backward scattering light produced from the interior and a surface of a measured object 1714 interferes with return light from the reference section so as to form interference light.

The light detecting section includes a light-receiving fiber 1708 and a photodetector 1709, and guides the interference light produced in the fiber coupler 1703 to the photodetector 1709.

The interference light received by the photodetector 1709 is converted into spectral signals by a signal processing unit 1711 and is further subjected to Fourier conversion, whereby depth information about the measured object 1714 is obtained. The obtained depth information is displayed as a tomographic image on an image output monitor 1713.

For example, the signal processing unit 1711 can be formed by a personal computer, and the image output monitor 1713 can be formed by a display screen of the personal computer.

The third embodiment is characterized in the light source section, in which the oscillation wavelength, intensity and the time change of the wavelength-tunable light source 1701 are controlled by the light-source control unit 1712.

The light-source control unit 1712 is connected to the signal processing unit 1711 that also controls a driving signal for the irradiation-position scanning mirror 1707, and controls the wavelength-tunable light source 1701 in synchronization with the driving of the scanning mirror 1707.

For example, when the light source apparatus of the first embodiment is used as the wavelength-tunable light source 1701 in the third embodiment, oscillation with a narrow spectral linewidth is achieved in wavelength sweeping. Hence, the coherence length increases. For this reason, interference images of the OCT image at a position at an equal distance from the reference mirror to a position far from the reference mirror can be obtained. This is because the long coherence length, that is, the long coherence distance allows the interference signal to be obtained even when the difference in length between two optical paths that form the interference optical system is long. For this reason, the oscillation spectral linewidth of the light source is preferably narrow because a deep structure of the measured object can be detected.

Figure 18:
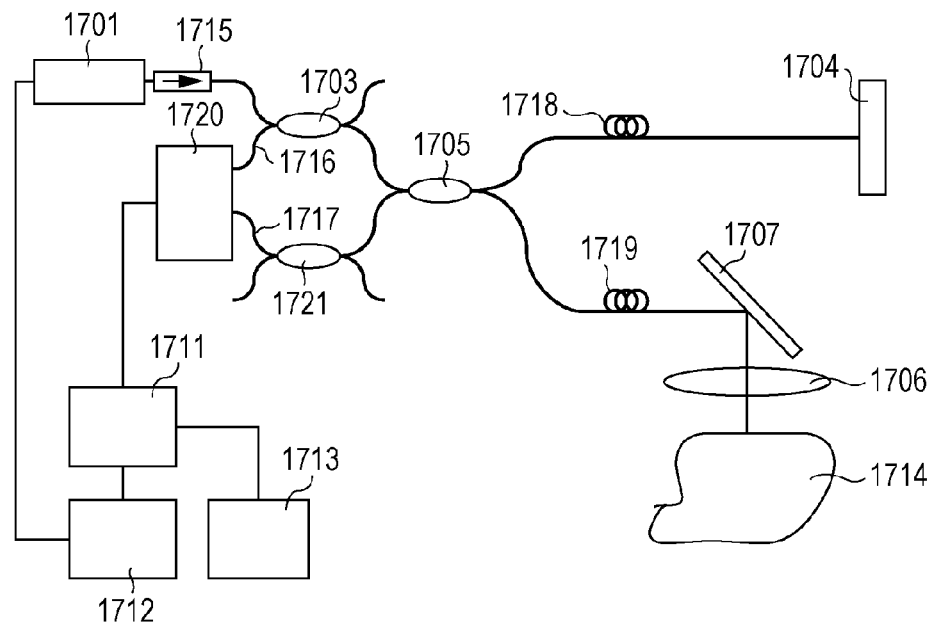
FIG. 18 illustrates the third embodiment of the present invention.

While the simple apparatus configuration is illustrated in FIG. 17, an optical system that performs differential detection of interference signals may be adopted, as illustrated in FIG. 18.

In FIG. 18, the same components as those in FIG. 17 are denoted by the same reference numerals.

An apparatus illustrated in FIG. 18 is mainly different from the apparatus of FIG. 17 in including, instead of the photodetector 1709 of FIG. 17, a balanced photodetector 1720 that functions as both a photodetector and a differential amplifier, and fiber couplers 1703 and 1704.

The balanced photodetector 1720 is connected at one end to a signal processing unit 1711, and has two terminals at the other end. One of the terminals is connected to an optical coupler 1703 via a fiber 1716, and the other terminal is connected to an optical coupler 1705 of a coupling unit via a fiber 1717 and an optical coupler 1721.

In the apparatus of the embodiment having these connections, an interference signal produced by reflected light from a measured object 1714 and a reference mirror 1704 is split into two components, and a difference therebetween is detected.

By splitting the light in two before the light reaches the balanced photodetector 1720, the phases of the two components of the interference signal become opposite. Hence, when the difference between the components is obtained by subtraction, only a DC component contained in the unsplit light is removed, and only the interference signal can be taken out. In FIG. 18, reference numerals 1718 and 1719 denote polarization controllers.

Further, it may be possible to sequentially monitor the intensity of light emitted from a light source 1701 and to use data on the intensity to correct the amplitude of the interference signal.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-172930 filed Jul. 30, 2010, which is hereby incorporated by reference herein in its entirety.

What is claimed is:

1. A light source apparatus comprising:
   an optical resonator including an optical amplification medium configured to amplify light and an optical switch; and
   a light irradiation source configured to apply an optical pulse to the optical switch,
   wherein the light source apparatus emits the light amplified by the optical amplification medium from the optical resonator,
   wherein the light irradiation source includes a wavelength-tunable light source, and the optical switch changes a transmittance or a reflectance thereof when receiving the optical pulse emitted from the wavelength-tunable light source,
   wherein the light source apparatus emits the amplified light from the optical resonator in correspondence with a center wavelength of the optical pulse,
   wherein a resonator length L of the optical resonator satisfies the following condition:

$$L < \frac{c}{nf}$$

where f represents a repetition frequency of the optical pulse applied from the light irradiation source to the optical switch, n represents an effective refractive index of the optical resonator, and c represents the speed of light in a vacuum, and
   wherein a recovery time $\tau$ in which the changed transmittance or reflectance of the optical switch recovers satisfies the following condition:

$$\tau > \frac{nL}{c}.$$

2. The light source apparatus according to claim 1, wherein the optical switch is a saturable absorber.

3. The light source apparatus according to claim 2, wherein a recovery time of the saturable absorber is shorter than a time interval between two optical pulses emitted from the light irradiation source.

4. The light source apparatus according to claim 1, wherein the optical pulse emitted from the light irradiation source is applied to the optical switch after passing through the optical amplification medium in the optical resonator.

5. The light source apparatus according to claim 1, wherein the optical resonator includes a gain flattening filter.

6. The light source apparatus according to claim 1, wherein the amplified light emitted from the optical resonator has a pulse duration which is longer than a duration of the optical pulse.

7. The light source apparatus according to claim 1, wherein the saturable absorber includes a reflective saturable absorber.

8. The light source apparatus according to claim 1, wherein the saturable absorber includes a transmissive saturable absorber.

9. The light source apparatus according to claim 1, wherein the optical amplification medium includes a semiconductor optical amplifier.

10. An optical coherence tomographic image pickup apparatus comprising:
    a light source section including the light source apparatus according to claim 1;
    a specimen measuring section configured to irradiate light from the light source section to a specimen and to transmit reflected from the specimen;
    a reference section configured to irradiate a reference mirror with light from light source section and to transmit reflected light from the reference mirror;
    an interference section configured to cause the reflected light from the specimen measuring section and the reflected light from the reference section to interfere with each other;
    a light detecting section configured to detect interference light from the interference section; and
    an image processing section configured to obtain a tomographic image of the specimen on the basis of the interference light detected by the light detecting section.

* * * * *